(12) United States Patent
Chowdhury et al.

(10) Patent No.: US 11,996,315 B2
(45) Date of Patent: May 28, 2024

(54) THIN SUBSTRATE HANDLING VIA EDGE CLAMPING

(71) Applicant: APPLIED MATERIALS, INC., Santa Clara, CA (US)

(72) Inventors: Abhishek Chowdhury, Bangalore (IN); Harisha Sathyanarayana, Bangalore (IN); Edwin C. Suarez, Pleasanton, CA (US); Siqing Lu, Santa Clara, CA (US); Nataraj Bhaskar Rao, Bangalore (IN)

(73) Assignee: APPLIED MATERIALS, INC., Santa Clara, CA (US)

( * ) Notice: Subject to any disclaimer, the term of this patent is extended or adjusted under 35 U.S.C. 154(b) by 398 days.

(21) Appl. No.: 16/951,823

(22) Filed: Nov. 18, 2020

(65) Prior Publication Data

US 2022/0157635 A1    May 19, 2022

(51) Int. Cl.
*H01L 21/687* (2006.01)
*C23C 16/455* (2006.01)
(Continued)

(52) U.S. Cl.
CPC .. *H01L 21/68721* (2013.01); *C23C 16/45536* (2013.01); *C23C 16/4582* (2013.01);
(Continued)

(58) Field of Classification Search
CPC ......... H01L 21/68721; H01L 21/02656; H01L 21/67017; H01L 21/6833; H01L 21/6831; H01L 21/68742; H01L 21/6875; C23C 16/45536; C23C 16/4582; C23C 16/4585; C23C 14/345; C23C 14/351; C23C 14/50; H01J 37/32642; H01J 37/32651; H01J 37/32715
See application file for complete search history.

(56) References Cited

U.S. PATENT DOCUMENTS

| 5,524,905 A | 6/1996 | Thoman et al. |
| 5,632,873 A * | 5/1997 | Stevens ............. H01L 21/68721 |
| | | 204/192.12 |

(Continued)

FOREIGN PATENT DOCUMENTS

| CN | 202130298568.7 | 5/2021 |
| EM | 0085443365-0002 | 5/2021 |

(Continued)

OTHER PUBLICATIONS

Search Report for Taiwan Design Application No. 110302307, dated Jul. 20, 2021.

(Continued)

*Primary Examiner* — Jeffrie R Lund
(74) *Attorney, Agent, or Firm* — MOSER TABOA

(57) ABSTRACT

Embodiments of process kits for use in a process chamber are provided herein. In some embodiments, a cover ring for use in a process chamber includes: an annular body that includes an upper surface and a lower surface, an inner lip extending radially inward and downward from the annular body, and a plurality of protrusions extending downward from the inner lip and disposed at regular intervals along the inner lip, wherein lowermost surfaces of the plurality of protrusions together define a planar substrate contact surface.

20 Claims, 6 Drawing Sheets

(51) Int. Cl.
*C23C 16/458* (2006.01)
*H01L 21/02* (2006.01)
*H01L 21/67* (2006.01)
*H01L 21/683* (2006.01)

(52) U.S. Cl.
CPC .... *C23C 16/4585* (2013.01); *H01L 21/02656* (2013.01); *H01L 21/67017* (2013.01); *H01L 21/6833* (2013.01)

(56) References Cited

U.S. PATENT DOCUMENTS

| | | | |
|---|---|---|---|
| 5,632,673 A | 6/1997 | Stevens et al. | |
| 5,810,931 A * | 9/1998 | Stevens | H01L 21/68721 118/721 |
| 6,051,122 A * | 4/2000 | Flanigan | C23C 16/4585 204/298.31 |
| 6,162,336 A * | 12/2000 | Lee | C23C 14/50 269/254 R |
| D557,226 S | 12/2007 | Uchino et al. | |
| D559,993 S | 1/2008 | Nagakubo et al. | |
| D559,994 S | 1/2008 | Nagakubo et al. | |
| 8,104,385 B2 * | 1/2012 | Hayashi | C03B 33/033 219/121.72 |
| 8,795,479 B2 * | 8/2014 | Bichler | H01L 21/68728 204/192.12 |
| D797,691 S | 9/2017 | Joubert et al. | |
| D827,592 S | 9/2018 | Ichino et al. | |
| D840,364 S | 2/2019 | Ichino et al. | |
| D870,314 S | 12/2019 | Isozaki et al. | |
| D888,903 S | 6/2020 | Gunther et al. | |
| D934,315 S | 10/2021 | Lavitsky et al. | |
| D954,986 S | 6/2022 | Nakatani | |
| 2004/0149226 A1 * | 8/2004 | Chen | H01L 21/68721 118/728 |
| 2005/0257746 A1 * | 11/2005 | Shirakawa | H01L 21/68728 118/728 |
| 2007/0209931 A1 | 9/2007 | Miller | |
| 2008/0178801 A1 | 7/2008 | Pavloff et al. | |
| 2010/0065216 A1 * | 3/2010 | Tiller | C23C 14/564 118/728 |
| 2013/0288477 A1 * | 10/2013 | Rieschl | H01L 21/68735 118/724 |
| 2014/0130743 A1 * | 5/2014 | Toriya | C23C 16/45574 118/725 |
| 2014/0190822 A1 | 7/2014 | Riker et al. | |
| 2014/0262763 A1 | 9/2014 | Rasheed et al. | |
| 2015/0332949 A1 | 11/2015 | Mori | |
| 2017/0011892 A1 * | 1/2017 | Guo | H01L 21/68735 |
| 2021/0020488 A1 | 1/2021 | Jiong et al. | |
| 2022/0157572 A1 * | 5/2022 | Chowdhury | C23C 14/3407 |
| 2022/0157635 A1 * | 5/2022 | Chowdhury | H01L 21/68721 |
| 2022/0246462 A1 | 8/2022 | Kim | |

FOREIGN PATENT DOCUMENTS

| | | | |
|---|---|---|---|
| JP | 4615659 B2 * | 1/2011 | H01L 21/68721 |
| JP | D2021-09879 | 5/2021 | |
| JP | D2021-28079 | 5/2021 | |
| KR | 302021002973 | 5/2021 | |
| TW | D161030 | 6/2014 | |
| TW | D167109 | 4/2015 | |
| TW | 110306065 | 5/2021 | |

OTHER PUBLICATIONS

International Search Report for PCT/US2021/059404, dated Mar. 14, 2022.

* cited by examiner

US 11,996,315 B2

THIN SUBSTRATE HANDLING VIA EDGE CLAMPING

FIELD

Embodiments of the present disclosure generally relate to a substrate processing equipment, and more specifically, to process kits for use in substrate processing equipment.

BACKGROUND

Deposition chambers for processing semiconductor substrates typically include a substrate support to support a substrate. Deposition chambers that use plasma typically include process kits disposed about the substrate support for protecting chamber walls from unwanted deposition and to confine the plasma. Process kits generally include a process shield, cover rings, deposition rings, or the like. Conventionally, the substrate may be retained to the substrate support via electrostatic chucking, vacuum chucking, gravity. However, the inventors have observed that the substrate, especially when thin (i.e., less than about 800 micrometers), may bow, resulting in process non-uniformity. In such cases, the substrate is typically bonded to a carrier plate. However, bonding the substrate adds additional processing time because of the additional bonding and debonding steps and requires additional tooling.

Accordingly, the inventors have provided improved apparatus and methods for flattening substrates.

SUMMARY

Embodiments of process kits for use in a process chamber are provided herein. In some embodiments, a cover ring for use in a process chamber includes: an annular body that includes an upper surface and a lower surface, an inner lip extending radially inward and downward from the annular body, and a plurality of protrusions extending downward from the inner lip and disposed at regular intervals along the inner lip, wherein lowermost surfaces of the plurality of protrusions together define a planar substrate contact surface.

In some embodiments, a process chamber for handling a substrate, includes: a chamber body defining an interior volume therein; a substrate support disposed in the interior volume for supporting the substrate thereon; and a cover ring to clamp an outer rim of the substrate to the substrate support, wherein the cover ring includes a plurality of protrusions extending downward and radially inward from an inner lip of the cover ring and disposed at regular intervals along the inner lip.

In some embodiments, a method of flattening a substrate in a process chamber includes: placing a substrate on a substrate support; and raising the substrate support to clamp an outer rim of the substrate against a cover ring, wherein the cover ring has an annular body, an inner lip extending radially inward and downward from the annular body, and a plurality of protrusions extending downward and radially inward from the inner lip and disposed at regular intervals along the inner lip, and wherein the substrate is clamped against the plurality of protrusions.

Other and further embodiments of the present disclosure are described below.

BRIEF DESCRIPTION OF THE DRAWINGS

Embodiments of the present disclosure, briefly summarized above and discussed in greater detail below, can be understood by reference to the illustrative embodiments of the disclosure depicted in the appended drawings. However, the appended drawings illustrate only typical embodiments of the disclosure and are therefore not to be considered limiting of scope, for the disclosure may admit to other equally effective embodiments.

Figure 1:
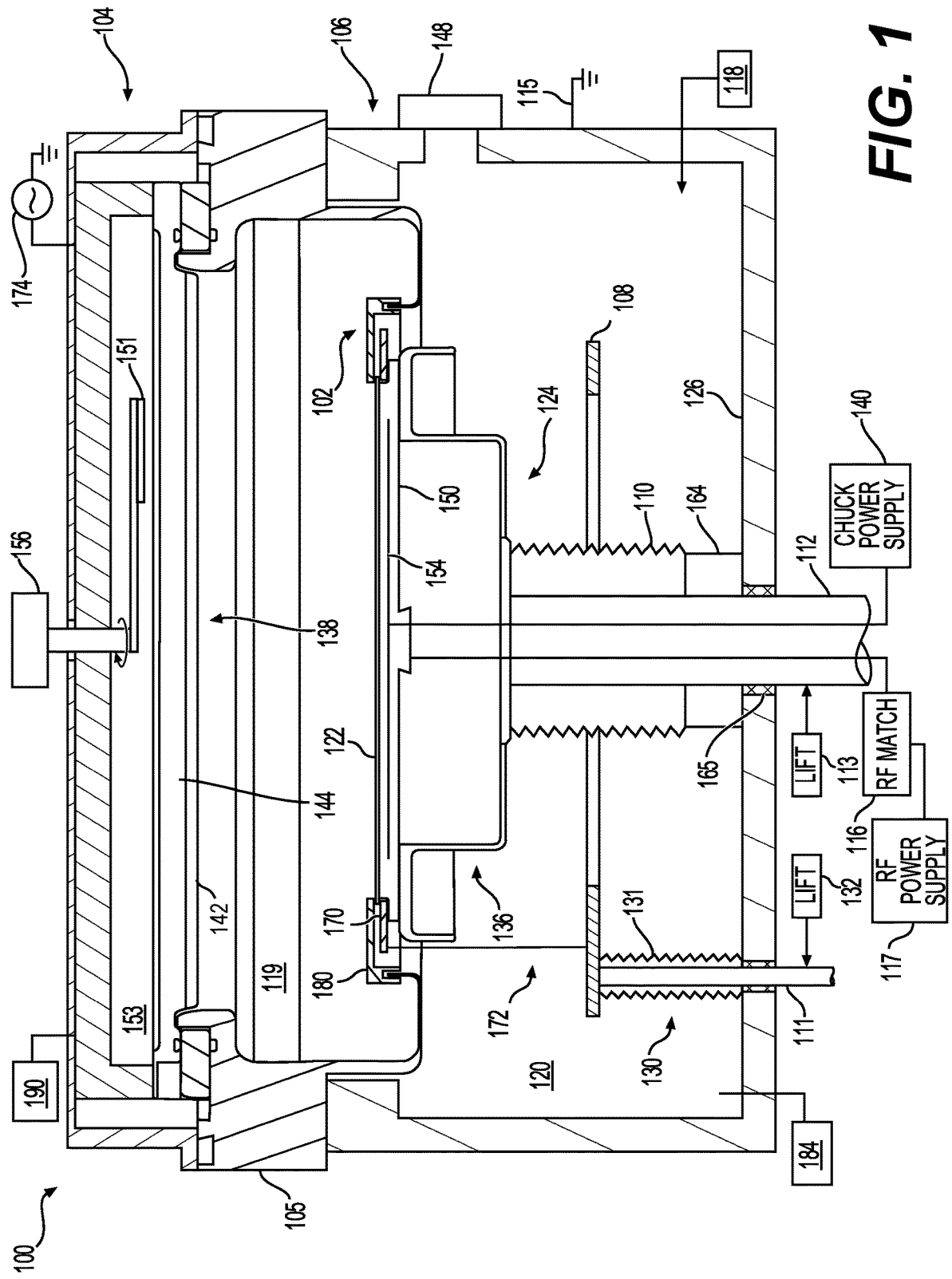
FIG. 1 depicts a schematic cross-sectional side view of process chamber in accordance with at least some embodiments of the present disclosure.

To facilitate understanding, identical reference numerals have been used, where possible, to designate identical elements that are common to the figures. The figures are not drawn to scale and may be simplified for clarity. Elements and features of one embodiment may be beneficially incorporated in other embodiments without further recitation.

DETAILED DESCRIPTION

Embodiments of process kits for use in a process chamber are provided herein. The inventive process kits advantageously facilitate clamping a peripheral edge of a substrate being processed in the process chamber to flatten the substrate. The use of mechanical clamping advantageously eliminates the use of bonded glass/carriers, shortening processing time by eliminating unneeded steps caused by bonded glass/carriers. The process kit may have features such a plurality of protrusions to advantageously minimize contact with the substrate while providing adequate clamping force. The process kit may have a terminal portion radially inward of the plurality of protrusions to advantageously shield the plurality of protrusions from plasma, which could lead to arcing.

In some embodiments, the substrate is a thin substrate, having a thickness of about 800 micrometers of less. In some embodiments, the substrate is a thin substrate, such as a Taiko wafer, having a thickness of about 30 micrometers to about 175 micrometers at a central portion. Taiko wafers generally include substrates that are back-grinded in the central portion, resulting in an outer rim having a thickness greater than the central portion of the substrate, for example about 175 micrometers to about 800 micrometers. Due to the relatively thin central portion and the thickness differential between the central portion and the outer rim, such wafers often deform, or warp, during processing. In some embodiments, the process kits provided herein are advantageously configured to contact an outer rim of the substrate (e.g., having a width of about 1.0 mm to about 3.0 mm) to handle, or flatten, the substrate.

FIG. 1 depicts a schematic cross-sectional side view of process chamber in accordance with at least some embodiments of the present disclosure. In some embodiments, the process chamber 100 is a physical vapor deposition (PVD) process chamber. However, other types of process chambers configured for different processes, for example, etching, chemical vapor deposition (CVD), atomic layer deposition (ALD), or the like, can also use or be modified for use with embodiments of the process kits described herein.

The process chamber 100 is a vacuum chamber which is suitably adapted to maintain sub-atmospheric pressures within an interior volume 120 during substrate processing. The process chamber 100 includes a chamber body 106 covered by a lid assembly 104 which encloses a processing volume 119 located in the upper half of the interior volume 120. The chamber body 106 and lid assembly 104 may be made of metal, such as aluminum. The chamber body 106 may be grounded via a coupling to ground 115.

A substrate support 124 is disposed within the interior volume 120 to support and retain a substrate 122, such as a semiconductor wafer, for example, or other such substrate as may be electrostatically retained. The substrate support 124 may generally comprise an electrostatic chuck 150 (or vacuum chuck for process chambers that are not vacuum chambers) disposed on a pedestal 136 and a hollow support shaft 112 for supporting the pedestal 136 and the electrostatic chuck 150. The electrostatic chuck 150 comprises a dielectric plate having one or more electrodes 154 disposed therein. The pedestal 136 is generally made of a metal such as aluminum. The pedestal 136 is biasable and can be maintained at an electrically floating potential or grounded during plasma operation. The hollow support shaft 112 provides a conduit to provide, for example, backside gases, process gases, fluids, coolants, power, or the like, to the electrostatic chuck 150.

Figure 2:
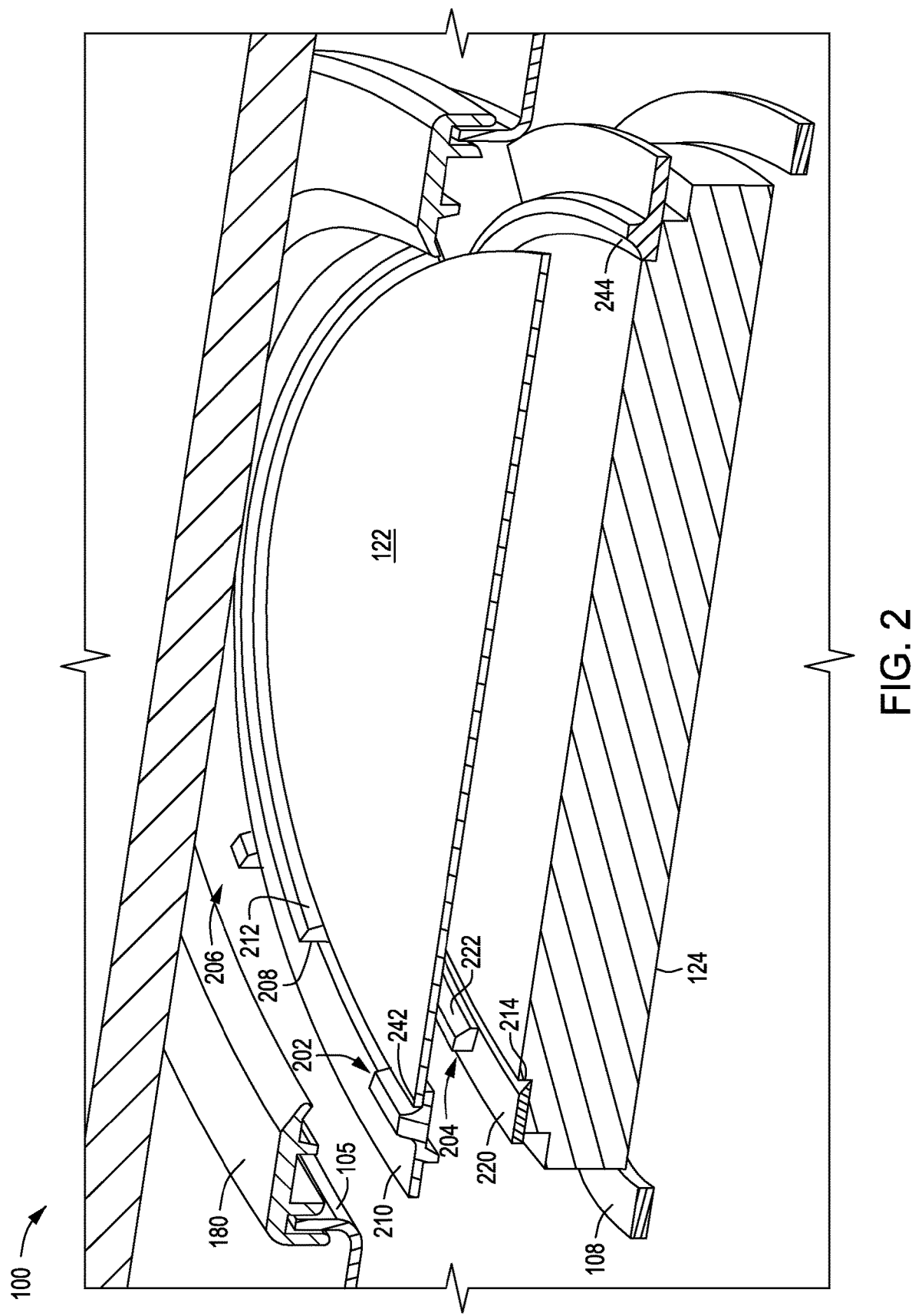
FIG. 2 depicts a cross-sectional isometric view of a portion of a process chamber in a first position in accordance with at least some embodiments of the present disclosure.
Figure 3:
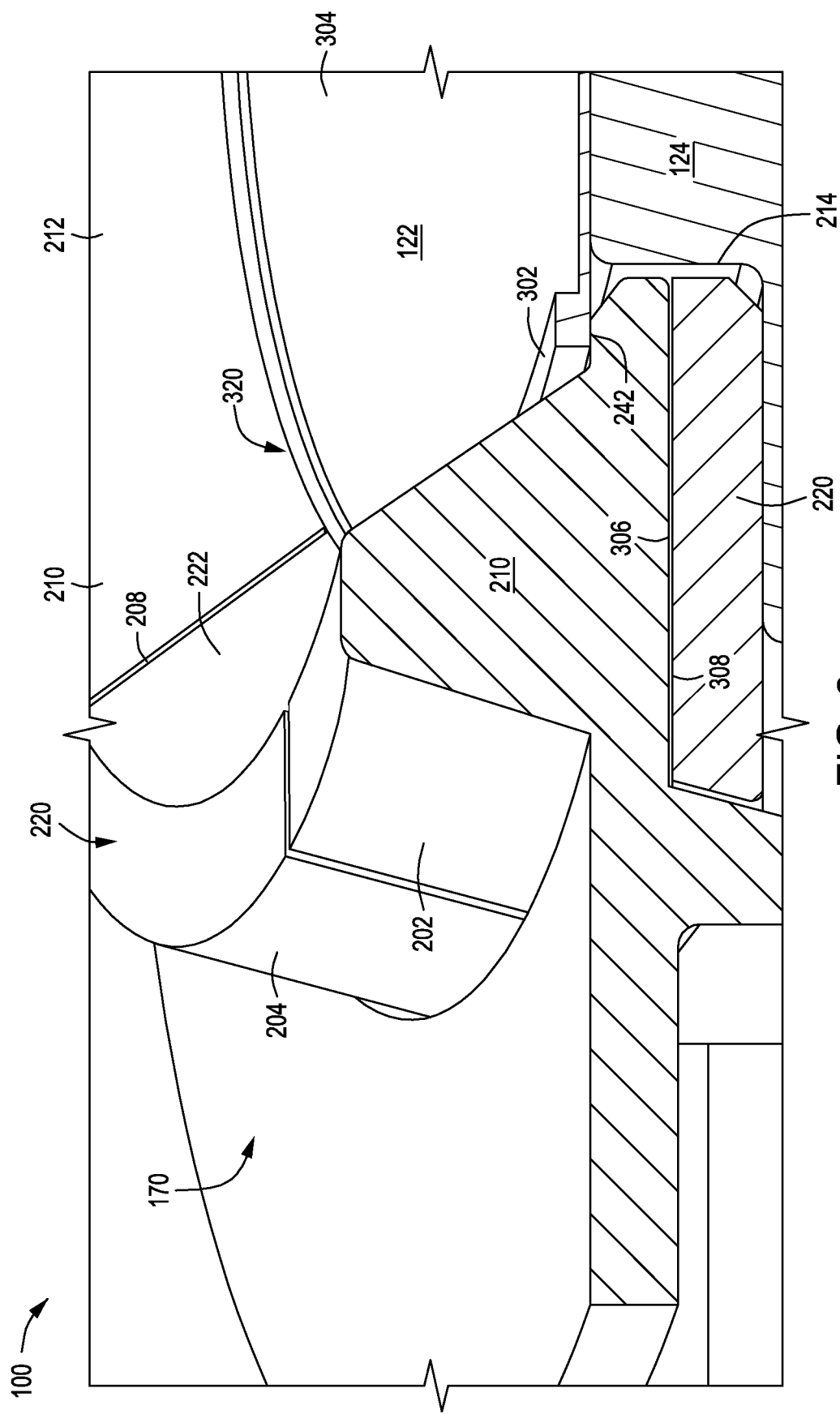
FIG. 3 depicts a cross-sectional isometric view of a portion of a process chamber in a second position in accordance with at least some embodiments of the present disclosure.

In some embodiments, the hollow support shaft 112 is coupled to a lift mechanism 113, such as an actuator or motor, which provides vertical movement of the electrostatic chuck 150 between an upper, processing position (as shown in FIG. 1) and one or more lower, transfer positions (See FIGS. 2 and 3). A bellows assembly 110 is disposed about the hollow support shaft 112 and is coupled between the electrostatic chuck 150 and a floor 126 of process chamber 100 to provide a flexible seal that allows vertical motion of the electrostatic chuck 150 while preventing loss of vacuum from within the process chamber 100. The bellows assembly 110 also includes a lower bellows flange 164 in contact with an o-ring 165 or other suitable sealing element which contacts the floor 126 to help prevent loss of chamber vacuum.

The hollow support shaft 112 provides a conduit for coupling a chuck power supply 140 and RF sources (e.g., RF power supply 174 and RF bias power supply 117) to the electrostatic chuck 150. In some embodiments, the RF power supply 174 and RF bias power supply 117 are coupled to the electrostatic chuck 150 via respective RF match networks (only RF match network 116 shown). In some embodiments, the substrate support 124 may alternatively include AC or DC bias power.

A substrate lift 130 can include a hoop lift 108 connected to a shaft 111 which is coupled to a second lift mechanism 132 for raising and lowering the substrate lift 130 so that the substrate 122 may be placed on or removed from the electrostatic chuck 150 via, for example, a deposition ring 170. In some embodiments, one or more lift members 172 are coupled to the hoop lift 108. The one or more lift members 172 are configured to selectively raise or lower at least a portion of the deposition ring 170. The electrostatic chuck 150 may include through holes to receive the one or more lift members 172. A bellows assembly 131 is coupled between the substrate lift 130 and floor 126 to provide a flexible seal which maintains the chamber vacuum during vertical motion of the substrate lift 130.

A target 138 is disposed in the processing volume 119 opposite the substrate support 124 to at least partially define a process volume therebetween. The substrate support 124 has a support surface having a plane substantially parallel to a sputtering surface of the target 138. The target 138 is connected to one or both of a DC power source 190 and/or the RF power supply 174.

The target 138 comprises a sputtering plate 142 mounted to a backing plate 144. The sputtering plate 142 comprises a material to be sputtered onto the substrate 122. The backing plate 144 is made from a metal, such as, for example, stainless steel, aluminum, copper-chromium or copper-zinc. The backing plate 144 can be made from a material having a thermal conductivity that is sufficiently high to dissipate the heat generated in the target 138, which form from eddy currents that arise in the sputtering plate 142 and the backing plate 144 and also from the bombardment of energetic ions from generated plasma onto the sputtering plate 142.

In some embodiments, the process chamber 100 includes a magnetic field generator 156 to shape a magnetic field about the target 138 to improve sputtering of the target 138. The capacitively generated plasma may be enhanced by the magnetic field generator 156 in which, for example, a plurality of magnets 151 (e.g., permanent magnet or electromagnetic coils) may provide a magnetic field in the process chamber 100 that has a rotating magnetic field having a rotational axis that is perpendicular to the plane of the substrate 122. The process chamber 100 may, in addition or alternatively, comprise a magnetic field generator 156 that generates a magnetic field near the target 138 to increase an ion density in the processing volume 119 to improve the sputtering of the target material. The plurality of magnets 151 may be disposed in a cavity 153 in the lid assembly 104. A coolant such as water may be disposed in or circulated through the cavity 153 to cool the target 138.

The process chamber 100 includes a process kit 102 circumscribing various chamber components to prevent unwanted reaction between such components and ionized process material. In some embodiments, the process kit 102 includes a process shield 105 surrounding the substrate support 124 and the target 138 to at least partially define the processing volume 119. For example, the process shield 105 may define an outer boundary of the processing volume 119. The DC power source 190 can apply a bias voltage to the target 138 relative to the process shield 105. In some embodiments, the process shield 105 is made of a metal such as aluminum.

In some embodiments, the process kit 102 includes the deposition ring 170 that rests on an outer edge of the electrostatic chuck 150. The process kit 102 includes a cover ring 180 disposed on the process shield 105 to form a tortuous gas flow path therebetween. In some embodiments, in the processing position, a radially inner portion of the cover ring 180 rests on the substrate 122 to clamp the substrate 122 against the substrate support 124. In some embodiments, the radially inner portion of the cover ring 180 rests on the substrate 122 to clamp the substrate support 124 against the deposition ring 170. In some embodiments, in the processing position, a radially inner portion of the cover ring 180 rests on the substrate 122 to clamp the substrate 122 against both the deposition ring 170 and the substrate support 124.

The process chamber 100 is coupled to and in fluid communication with a vacuum system 184 which includes a throttle valve (not shown) and vacuum pump (not shown) which are used to exhaust the process chamber 100. The pressure inside the process chamber 100 may be regulated by adjusting the throttle valve and/or vacuum pump. The process chamber 100 is also coupled to and in fluid communication with a process gas supply 118 which may supply one or more process gases to the process chamber 100 for processing the substrate 122 disposed therein. A slit valve 148 may be coupled to the chamber body 106 and aligned with an opening in a sidewall of the chamber body 106 to facilitate transferring the substrate 122 into and out of the chamber body 106.

In use, substrate 122 may be transferred into the interior volume 120 via a transfer robot (not shown). In some embodiments, the substrate lift 130 may raise a first portion 210 of the deposition ring 170 to a first position, above the substrate support 124 (see FIG. 2). In some embodiments, the lift mechanism 113 raises the substrate support 124 and a second portion 220 of the deposition ring 170 to a second position, where the first portion 210 rests on the second portion 220 (see FIG. 3). In some embodiments, the lift mechanism 113 raises the substrate support 124, the first portion 210 of the deposition ring, and the second portion 220 of the deposition ring 170 to a third position, or processing position. Such a deposition ring is described in more detail in U.S. patent application Ser. No. 16/951,805, filed Nov. 18, 2020, and entitled "DEPOSITION RING FOR THIN SUBSTRATE HANDLING VIA EDGE CLAMPING".

In use, while the DC power source 190 supplies power to the target 138 and other chamber components connected to the DC power source 190, the RF power supply 174 energizes the sputtering gas (e.g., from the process gas supply 118) to form a plasma of the sputtering gas. The plasma formed impinges upon and bombards the sputtering surface of the target 138 to sputter material off the target 138 onto the substrate 122. In some embodiments, RF energy supplied by the RF power supply 174 may range in frequency from about 2 MHz to about 60 MHz, or, for example, non-limiting frequencies such as 2 MHz, 13.56 MHz, 27.12 MHz, or 60 MHz can be used. In some embodiments, a plurality of RF power sources may be provided (i.e., two or more) to provide RF energy in a plurality of the above frequencies. An additional RF power source, (e.g., RF bias power supply 117) can also be used to supply a bias voltage to the substrate support 124 to attract ions form the plasma towards the substrate 122.

FIG. 2 depicts a cross-sectional isometric view of a portion of a process chamber in a first position in accordance with at least some embodiments of the present disclosure. In the first position, a first portion 210 of the deposition ring 170 is disposed above a second portion 220 of the deposition ring 170. The cover ring 180 is disposed above the substrate support 124 and the deposition ring 170 (i.e., the first portion 210 and the second portion 220). In some embodiments, the first portion 210 has an arcuate shape without being a complete ring to accommodate a transfer blade of a transfer robot. The first portion 210 includes a first inner ledge 242 for supporting the substrate 122 thereon. In some embodiments, the first portion 210 includes a first raised portion 202 having an inner surface 212 disposed radially outward of the first inner ledge 242. In some embodiments the inner surface 212 is sloped to guide the substrate 122 to the first inner ledge 242. In some embodiments, the first portion 210 includes one or more cutouts 208 to accommodate end effectors of the transfer robot. In some embodiments, the one or more cutouts 208 extend through the first raised portion 202. The first portion 210 may rest on one or more support tabs 206 that are coupled to the one or more lift members 172. The one or more support tabs 206 facilitate raising or lowering the first portion 210 with respect to the substrate support 124. The one or more support tabs 206 may have an arcuate shape corresponding with a shape of the first portion 210.

In some embodiments, the second portion 220 rests on or is otherwise coupled to the substrate support 124. In some embodiments, the second portion 220 has an annular shape. In some embodiments, the second portion 220 is disposed in a peripheral groove 214 of the substrate support 124. The second portion 220 includes a second inner ledge 244 for supporting the substrate 122 thereon when in the second position or third position. In some embodiments, the second portion 220 includes a second raised portion 204 having an inner surface 222 disposed radially outward of the second inner ledge 244. The second raised portion 204 may have a shape corresponding with a shape of the first raised portion 202. In some embodiments the inner surface 212 is sloped to guide the substrate 122 to the second inner ledge 244.

FIG. 3 depicts a cross-sectional isometric view of a portion of a process chamber in a second position in accordance with at least some embodiments of the present disclosure. In the second position, the second portion 220 of the deposition ring 170 and the substrate support 124 are raised so that the substrate 122 also rests on the substrate support 124. In the second position, a lower surface 306 of the first portion 210 may rest on an upper surface 308 of the second portion 220. In some embodiments, the first portion 210 and the second portion 220 of the deposition ring 170 may nest into each other so that the inner surface 212 of the first portion 210 is substantially coplanar with the inner surface 222 of the second portion 220. For example, the second raised portion 204 may extend into the one or more cutouts 208 of the first portion 210. In some embodiments, the first portion 210 has an outer diameter greater than an outer diameter of the second portion 220.

In the second position, the first inner ledge 242 and the second inner ledge 244 are configured to align to form, together, a clamping surface 320 for an outer rim 302 of the substrate 122 to rest on. In some embodiments, the clamping surface 320 is an annular surface. In some embodiments, the outer rim 302 has a width of about 1.0 mm to about 3.0 mm. In some embodiments, the outer rim 302 has a thickness of about 50 micrometers to about 800 micrometers. In some embodiments, the outer rim 302 has a thickness greater than a central portion 304 of the substrate.

Figure 4:
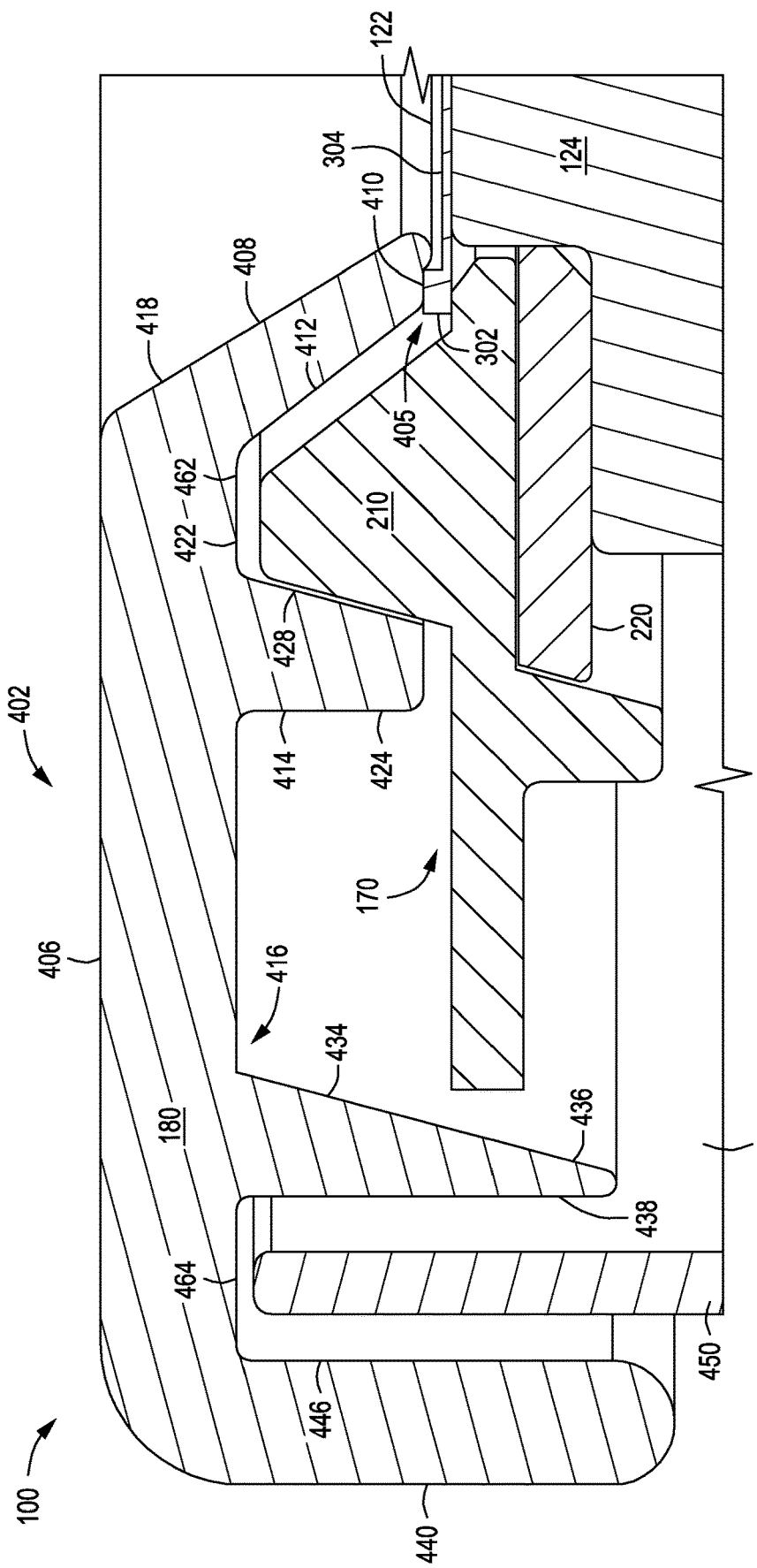
FIG. 4 depicts a cross-sectional side view of a portion of a process chamber in a third position in accordance with at least some embodiments of the present disclosure.

FIG. 4 depicts a cross-sectional side view of a portion of a process chamber in a third position in accordance with at least some embodiments of the present disclosure. The third position is generally a processing position. In the third position, the cover ring 180 is configured to clamp the outer rim 302 of the substrate 122 against at least one of the substrate support 124 or the deposition ring 170.

The cover ring 180 generally has an annular body 402 that includes an upper surface 406 and a lower surface 416. In some embodiments, the upper surface 406 is substantially flat. In some embodiments, the cover ring 180 is made of a ceramic material. In some embodiments, an inner lip 408 extends radially inward and downward from the annular body 402. In some embodiments, the inner lip 408 extends radially inward and downward at an angle of about 40 to about 70 degrees from the upper surface 406 of the annular body 402. The inner lip 408 includes an outer surface 412 and an inner surface 418. The inner lip 408 may clamp the substrate 122. The inner lip 408 may include a plurality of protrusions 410 extending downward from the inner lip 408. In some embodiments, the plurality of protrusions 410 extend from an outer surface 412 of the inner lip 408. In some embodiments, the plurality of protrusions 410, together, define a planar substrate contact surface 405 for clamping the substrate 122. In some embodiments, the cover ring 180, when disposed on the deposition ring 170, has a space of about 700 to about 850 micrometers between the clamping surface 320 of the deposition ring 170 and the planar substrate contact surface 405 of the plurality of protrusions 410.

In some embodiments, the cover ring 180 includes a first ring 414 that extends downward from the lower surface 416 of the annular body 402. In some embodiments, the first ring 414 and the inner lip 408 define a first channel 422 therebetween to accommodate the deposition ring 170. In some embodiments, an outer surface 424 of the first ring 414 extends substantially vertically downward from the annular body 402. In some embodiments, an inner surface 428 of the first ring 414 extends downward and radially outward. In some embodiments, the inner lip 408 extends downward beyond the first ring 414.

In some embodiments, a second ring 434 extends downward from the lower surface 416 of the annular body 402. In some embodiments, an inner surface 436 of the second ring 434 extends downward and radially outward. In some embodiments, an outer surface 438 of the second ring 434 extends substantially vertically downward. In some embodiments, the second ring 434 extends downward beyond the first ring 414. In some embodiments, the second ring 434 is disposed radially outward of the deposition ring 170.

In some embodiments, an outer lip 440 extends downward from the annular body 402. In some embodiments, the second ring 434 and the outer lip 440 define a second channel 446 therebetween to accommodate an inner lip 450 of the process shield 105. In some embodiments, the inner lip 450 of the of the process shield 105 overlaps with the outer lip 440 of the cover ring 180 to form a tortuous flow path therebetween. In some embodiments, the outer lip 440 extends downward beyond the second ring 434. In some embodiments, the outer lip 440 extends downward from the annular body 402 beyond the inner lip 408. In some embodiments, the outer lip 440 is disposed closer to the second ring 434 than the first ring 414. In some embodiments, a floor 462 of the first channel 422 is substantially along a same horizontal plane as a floor 464 of the second channel 446.

Figure 5:
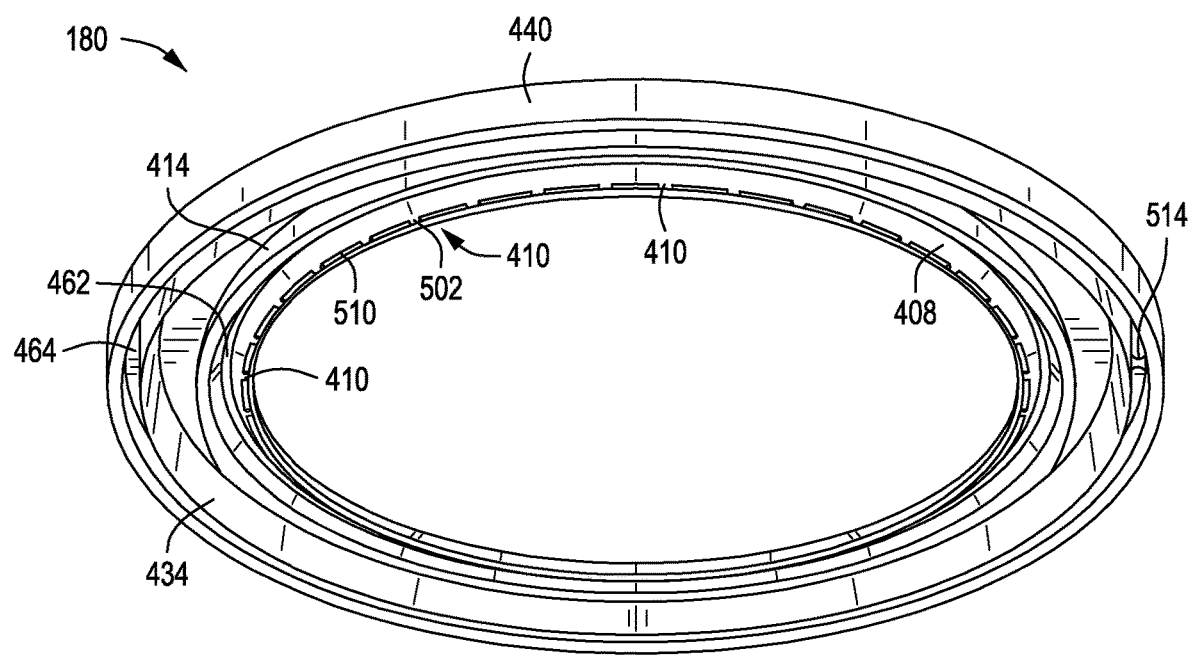
FIG. 5 depicts an isometric bottom view of a cover ring in accordance with some embodiments of the present disclosure.

FIG. 5 depicts an isometric bottom view of a cover ring in accordance with some embodiments of the present disclosure. In some embodiments, as shown in FIG. 5, the plurality of protrusions 410 are disposed at regular intervals along the inner lip 408. In some embodiments, lowermost surfaces 502 of the plurality of protrusions 410, together, define the planar substrate contact surface 405. The plurality of protrusions 410 advantageously provide enough clamping force to flatten the substrate 122 while providing minimum contact points with the substrate 122 to prevent sticking and deposition build up. In some embodiments, each of the plurality of protrusions 410 have a width of about 2.0 mm to about 10.0 mm. In some embodiments, the inner lip 408 includes a plurality of recessed portions 510 disposed between the plurality of protrusions. In some embodiments, the plurality of recessed portions 510 have a width less than a width of the plurality of protrusions 410. In some embodiments, the floor 464 of the second channel 446 may include one or more alignment features 514 for aligning the cover ring 180 to the process shield 105. The alignment features 514 may be grooves, slots, pins, or the like.

Figure 6A:
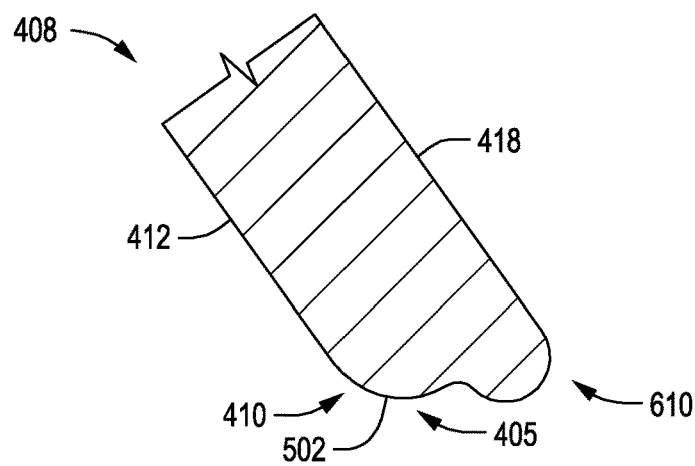
FIG. 6A depicts an enlarged cross-sectional side view of a portion of a cover ring in accordance with some embodiments of the present disclosure.
Figure 6B:
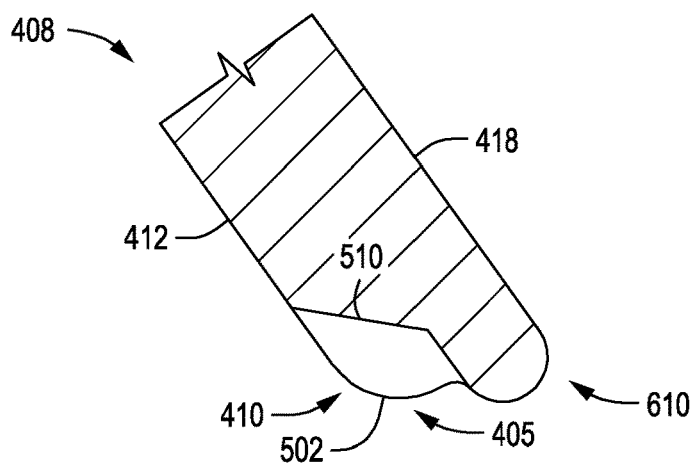
FIG. 6B depicts an enlarged cross-sectional side view of a portion of a cover ring in accordance with some embodiments of the present disclosure.

FIG. 6A depicts an enlarged cross-sectional side view of a portion of a cover ring taken along a protrusion of the plurality of protrusions 410 in accordance with some embodiments of the present disclosure. FIG. 6A depicts an enlarged cross-sectional side view of a portion of a cover ring taken along a recessed portion of the plurality of recessed portions 510. In some embodiments, the inner lip 408 of the cover ring 180 includes a terminal portion 610. In some embodiments, the terminal portion 610 of the inner lip 408 extends beyond the planar substrate contact surface 405 of the plurality of protrusions 410 to advantageously provide a plasma barrier to reduce or prevent arcing. In some embodiments, the terminal portion 610 extends sufficiently beyond the planar substrate contact surface 405 to prevent a direct line of sight from the target 138 to the planar substrate contact surface 205. In some embodiments, in the processing position, the terminal portion 610 is about 0.2 mm to about 2.0 mm from an upper surface of the central portion 304 of the substrate 122. In some embodiments, the terminal portion 610 includes rounded edges. In some embodiments, the plurality of protrusions 410 have rounded edges.

Figure 7:
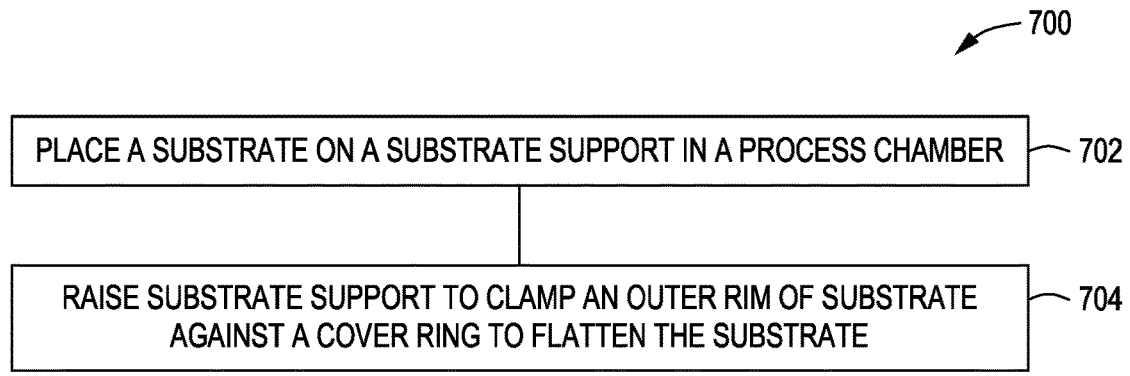
FIG. 7 depicts a method of flattening a substrate in a process chamber in accordance with some embodiments of the present disclosure.

FIG. 7 depicts a method 700 of flattening a substrate (e.g., substrate 122) in a process chamber (e.g., process chamber 100) in accordance with some embodiments of the present disclosure. In some embodiments, the substrate has a thickness of about 20 microns to about 800 microns. In some embodiments, the substrate has a thickness of about 20 microns to about 150 microns. In some embodiments, the process chamber is a PVD chamber. At 702, the method 700 comprises placing the substrate on a substrate support (e.g., substrate support 124). In some embodiments, a central portion (e.g., central portion 304) of the substrate is electrostatically chucked (e.g., via electrostatic chuck 150) or vacuum chucked to the substrate support. In some embodiments, prior to 702, the substrate is placed on at least a portion of a deposition ring (e.g., deposition ring 170) prior to placing the substrate on the substrate support.

At 704, the substrate support is raised to clamp an outer rim (e.g., outer rim 302) of the substrate against a cover ring (e.g., cover ring 180) to advantageously flatten the substrate. In some embodiments, the outer ring comprises a region about 1.0 mm to about 3.0 mm from an outer sidewall of the substrate. In some embodiments, the substrate is clamped between the deposition ring and a plurality of protrusions (e.g., plurality of protrusions 410) to provide minimal contact between the cover ring and the substrate. In some embodiments, once the substrate is clamped, the process chamber performs a subsequent deposition, etching, or cleaning process.

While the foregoing is directed to embodiments of the present disclosure, other and further embodiments of the disclosure may be devised without departing from the basic scope thereof.

The invention claimed is:

1. A cover ring for use in a process chamber, comprising:
an annular body that includes an upper surface and a lower surface, an inner lip extending radially inward and downward from the annular body, and a plurality of protrusions extending downward from the inner lip and disposed at intervals along the inner lip, wherein lowermost surfaces of the plurality of protrusions together define a planar substrate contact surface, and wherein a terminal portion of the inner lip extends vertically downward beyond the planar substrate contact surface of the plurality of protrusions.

2. The cover ring of claim 1, wherein the cover ring includes a first ring that extends downward from a lower surface of the annular body, wherein an inner surface of the first ring is tapered to extend downward and radially outward and an outer surface of the first ring extends vertically downward, wherein the first ring and the inner lip define a first channel therebetween to accommodate a deposition ring.

3. The cover ring of claim 2, wherein a second ring extends downward from a lower surface of the annular body, wherein an inner surface of the second ring extends downward and radially outward.

4. The cover ring of claim 3, wherein an outer lip extends downward from the annular body, wherein the second ring and the outer lip define a second channel therebetween to accommodate an inner lip of a process shield.

5. The cover ring of claim 4, wherein the outer lip extends downward from the annular body beyond the inner lip.

6. The cover ring of claim 1, wherein the plurality of protrusions have rounded edges.

7. The cover ring of claim 1, wherein the terminal portion of the inner lip extends radially inward beyond the planar substrate contact surface of the plurality of protrusions.

8. A process kit comprising the cover ring of claim 1, and further comprising a deposition ring, wherein an upper surface of the deposition ring and the plurality of protrusions of the cover ring, together, are configured to clamp an outer rim of a substrate.

9. The process kit of claim 8, wherein the cover ring, when disposed on the deposition ring, has a space of about 700 to about 850 micrometers between a clamping surface of the deposition ring and the planar substrate contact surface of the plurality of protrusions.

10. A process chamber for handling a substrate, comprising:
a chamber body defining an interior volume therein;
a substrate support disposed in the interior volume for supporting the substrate thereon; and
the cover ring of claim 1 configured to clamp an outer rim of the substrate to the substrate support.

11. The process chamber of claim 10, wherein the cover ring includes a first ring that extends downward from a lower surface of the cover ring, wherein an inner surface of the ring extends downward and radially outward, wherein the first ring and the inner lip define a first channel therebetween to accommodate a deposition ring.

12. The process chamber of claim 11, further comprising a deposition ring disposed on the substrate support, the deposition ring having a first raised portion that extends into the first channel when the cover ring and the deposition ring clamp the outer rim of the substrate therebetween.

13. The process chamber of claim 10, further comprising a process shield disposed in the interior volume about the substrate support, wherein an inner lip of the process shield overlaps with an outer lip of the cover ring to form a tortuous flow path therebetween.

14. The process chamber of claim 10, wherein the plurality of protrusions have rounded edges.

15. A method of flattening a substrate in a process chamber using the cover ring of claim 1, comprising:
placing a substrate on a substrate support; and
raising the substrate support to clamp an outer rim of the substrate against the plurality of protrusions of the cover ring.

16. The method of claim 15, further comprising chucking a central portion of the substrate via an electrostatic chuck.

17. The method of claim 15, further comprising placing the substrate on at a portion of a deposition ring prior to placing the substrate on the substrate support.

18. The method of claim 15, wherein the outer rim of the substrate comprises a region about 1.0 mm to about 3.0 mm from an outer sidewall of the substrate.

19. The method of claim 15, wherein the substrate is clamped between the plurality of protrusions of the cover ring and a deposition ring disposed on the substrate support.

20. The method of claim 15, wherein the substrate has a thickness of about 20 microns to about 150 microns.

* * * * *